United States Patent
Tanabe

(10) Patent No.: US 8,487,734 B2
(45) Date of Patent: Jul. 16, 2013

(54) INDUCTOR

(75) Inventor: Akira Tanabe, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/397,264

(22) Filed: Feb. 15, 2012

(65) Prior Publication Data

US 2012/0211864 A1    Aug. 23, 2012

Related U.S. Application Data

(63) Continuation of application No. 12/523,578, filed as application No. PCT/JP2008/051134 on Jan. 21, 2008, now Pat. No. 8,143,986.

(30) Foreign Application Priority Data

Jan. 24, 2007    (JP) ................................. 2007-014061

(51) Int. Cl.
*H01F 27/28* (2006.01)
*H01F 27/29* (2006.01)
*H01F 5/00* (2006.01)

(52) U.S. Cl.
USPC ............ 336/222; 336/192; 336/200; 336/223

(58) Field of Classification Search
USPC ................... 336/200, 222, 223, 192, 182, 232
See application file for complete search history.

(56) References Cited

U.S. PATENT DOCUMENTS

| 5,610,433 | A  | * | 3/1997  | Merrill et al. ................. 257/531 |
| 5,831,331 | A  |   | 11/1998 | Lee |
| 6,396,362 | B1 | * | 5/2002  | Mourant et al. ................. 333/25 |
| 6,466,122 | B1 |   | 10/2002 | Hasegawa et al. |
| 6,967,555 | B2 | * | 11/2005 | Yu et al. ......................... 336/200 |
| 7,164,339 | B2 | * | 1/2007  | Huang ........................... 336/200 |
| 7,224,254 | B2 |   | 5/2007  | Choi et al. |
| 7,598,838 | B2 |   | 10/2009 | Hargrove et al. |
| 8,143,986 | B2 | * | 3/2012  | Tanabe .......................... 336/200 |
| 2004/0056749 | A1 | * | 3/2004 | Kahlmann et al. ............ 336/200 |
| 2004/0095222 | A1 |   | 5/2004 | Liang et al. |
| 2008/0079530 | A1 |   | 4/2008 | Weidman |

FOREIGN PATENT DOCUMENTS

| JP | 1991008311 A | 1/1991 |
| JP | 1991263366 A | 11/1991 |
| JP | 1993258977 A | 10/1993 |

(Continued)

*Primary Examiner* — Mohamad Musleh
*Assistant Examiner* — Mangtin Lian
(74) *Attorney, Agent, or Firm* — Sughrue Mion, PLLC

(57) ABSTRACT

Parasitic capacitance between upper and lower adjacent wirings of an inductor using a multilayer wiring layer in an insulating film formed on a base substrate is reduced. An inductor is characterized by having one go-around of go-around wiring (A-B or B-C) formed in each of at least two of adjacent wiring layers of a plurality of wiring layers 18 placed in an insulating film on a base substrate, and in that one end (B) of the one go-around of go-around wiring (A-B and B-C) formed in each of the at least two of wiring layers is connected to each other at a via and the one go-around of go-around wiring (A-B and B-C) formed in each of the at least two of wiring layers is placed at substantially the same position in a surface of the base substrate when viewed from an upper side of the base substrate.

18 Claims, 13 Drawing Sheets

FOREIGN PATENT DOCUMENTS

| | | |
|---|---|---|
| JP | 1994120048 A | 4/1994 |
| JP | 1995142258 A | 6/1995 |
| JP | 1996017656 A | 1/1996 |
| JP | 8162331 A | 6/1996 |
| JP | 2001036017 A | 2/2001 |
| JP | 2001085248 A | 3/2001 |
| JP | 2001267512 A | 9/2001 |
| JP | 2004140165 A | 5/2004 |
| JP | 2005005685 A | 1/2005 |
| JP | 2006203082 A | 8/2006 |
| JP | 2006245273 A | 9/2006 |
| JP | 2006245455 A | 9/2006 |

\* cited by examiner

INDUCTOR

CROSS REFERENCE TO RELATED APPLICATIONS

This application is a Continuation of U.S. patent application Ser. No. 12/523,578, filed on Jul. 17, 2009, which is a National Stage of International Application No. PCT/JP2008/051134, filed on Jan. 21, 2008, which claims priority from Japanese Patent Application No. 2007-014061, the contents of all of which are incorporated herein by reference in their entirety.

TECHNICAL FIELD

The present invention relates to a structure of an inductor disposed in an insulating film formed on a base substrate.

BACKGROUND ART

Recently, various high-speed digital wireless systems such as a wireless LAN, Bluetooth, Terrestrial Digital Television have been put to practical use. Most of these wireless systems are realized by a circuit formed on a semiconductor chip, that is, an on-chip inductor.

Various types of inductors have ever been disclosed as an on-chip inductor. Inductors disclosed in Patent Literature 1 (Japanese Patent Application Publication No. 07-142258), Patent Literature 2 (Japanese Patent Application Publication No. 08-017656) and Patent Literature 3 (Japanese Patent Application Publication No. 2006-245455) are inductors in which go-around wiring is formed on a semiconductor substrate in a planar manner via an insulating layer.

An inductor disclosed in Patent Literature 4 (Japanese Patent Application Publication No. 2004-140165) is an inductor in which go-around wiring is formed in a wiring layer on a substrate in a planar manner.

An inductor disclosed in Patent Literature 5 (Japanese Patent Application Publication No. 2001-267512) is an inductor in which spiral patterns each having the same shape are formed on two upper layers thereof in a three-layer wiring structure formed on a Si substrate and they are connected in parallel.

DISCLOSURE OF THE INVENTION

Problems to be Solved by the Invention

However, in the case of the inductors constructed in a planar manner as described in Patent Literatures 1 to 4, it was difficult to increase the number of turns without increasing a device size when the number of turns must be increased to increase inductance depending upon use application of the inductor.

Further, in the case where spiral patterns each having the same shape are formed in two wiring layers formed on a Si substrate as described in Patent Literature 5, an interlayer film thickness is generally small in a multilayer wiring layer within an insulating film formed on a semiconductor substrate. Thus, large parasitic capacitance tends to be generated depending upon wiring capacity between upper and lower ones. Increase in parasitic capacitance causes deterioration in performance of the inductor, such as lowing of a usable frequency. Moreover, in the case where a number of wiring layers are simply used when the number of turns must be increased to increase inductance depending upon use application of the inductor, the number of wirings having adjacent wiring above or below it becomes large. Thus, a problem of interwiring parasitic capacitance becomes pronounced.

An exemplary subject of the present invention is to solve the problems described above, and it is an exemplary object of the present invention to reduce parasitic capacitance between upper and lower adjacent wirings of an inductor using a multilayer wiring layer in an insulating film formed on a base substrate.

Means for Solving the Problems

In order to achieve the above exemplary object, according to the present invention, an inductor that is at least two rolls of inductor placed in an insulating film formed on a base substrate, wherein the inductor includes a first inductor, wherein the first inductor has one go-around of go-around wiring formed in each of at least two of adjacent wiring layers of a plurality of wiring layers formed in the insulating film, wherein one end of the one go-around of go-around wiring formed in each of the at least two of wiring layers is connected to each other at a via, and wherein the one go-around of go-around wiring formed in each of the at least two of wiring layers is placed at substantially the same position in a surface of the base substrate when viewed from an upper side of the base substrate, is obtained.

Effects of the Invention

According to this configuration, in the present invention, it is possible to reduce parasitic capacitance between upper and lower adjacent wirings. This exemplary effect to reduce the parasitic capacitance between wirings allows an inductor to restrain a usable frequency from lowering.

BEST MODE FOR CARRYING OUT THE INVENTION

Figure 1A:
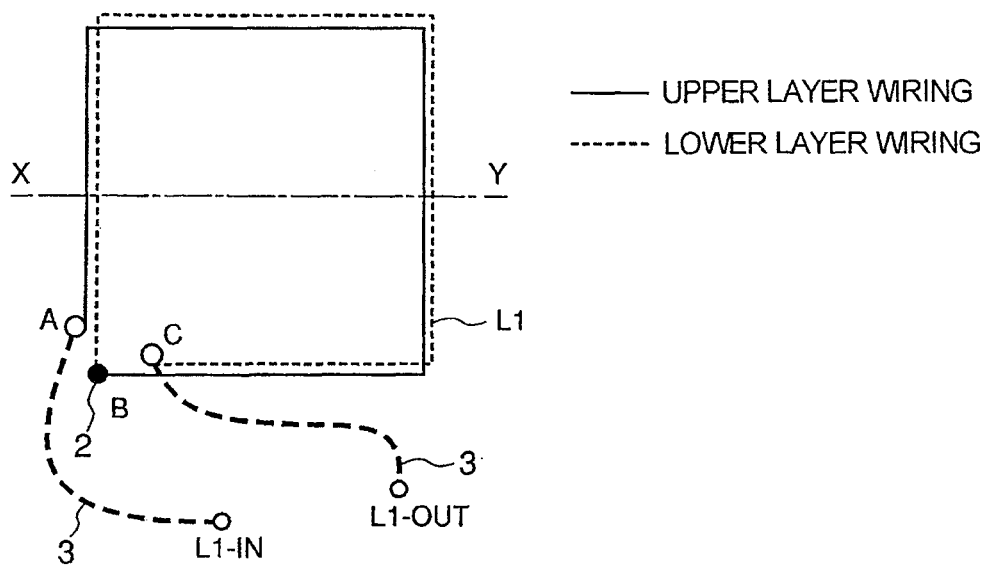
FIG. 1A is a plan view of an inductor according to an exemplary embodiment of the present invention.
Figure 1B:
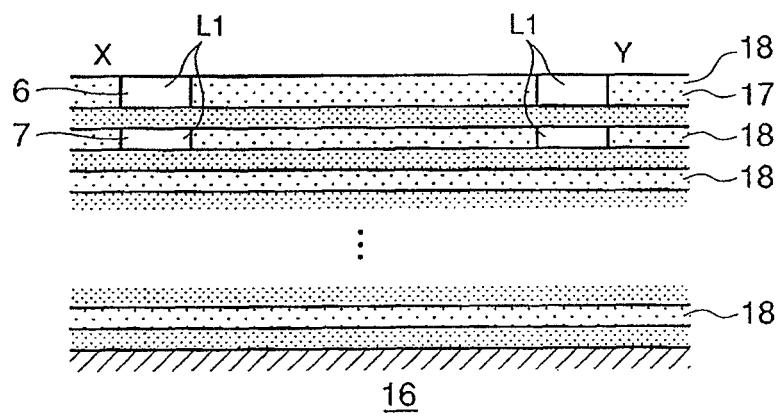
FIG. 1B is a sectional view taken along the X-Y line of FIG. 1A.

Hereinafter, a preferred exemplary embodiment of the present invention will be described in detail with reference to the accompanying drawings. FIG. 1A is a plan view of an inductor according to the exemplary embodiment of the present invention when viewed from an upper side of a base substrate 16. FIG. 1B is a sectional view of the inductor according to the exemplary embodiment of the present invention on the X-Y line of FIG. 1A when viewed from a side direction of the base substrate 16. The inductor according to the exemplary embodiment of the present invention was manufactured using M5 wiring 6 and M4 wiring 7 of the next lower layer in a six-layer Cu wiring process of a 90 nm node. A wiring width was 3 μm. Although an interlayer film thickness differs depending upon the wiring layer, an interlayer film thickness between the M5 wiring 6 and the M4 wiring 7 was about 0.3 μm. Outermost wiring of the inductor when viewed from the upper side of the base substrate 16 was made so as to form a square measuring 120 μm on a side.

Figure 2:
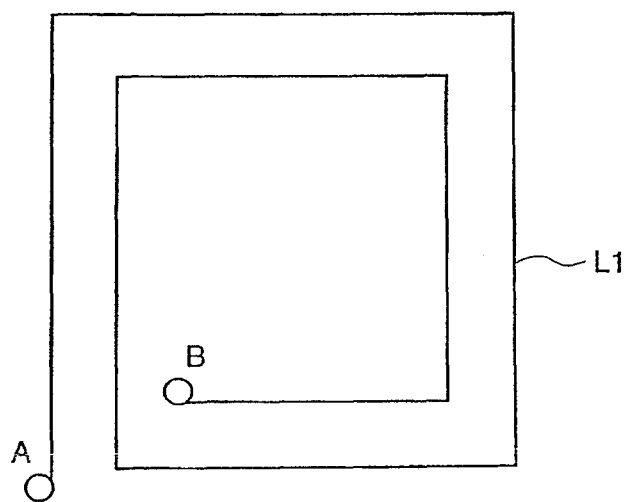
FIG. 2 is a plan view of an inductor (related art)

On the other hand, an inductor (related art) shown in FIG. 2 was manufactured by the M5 wiring 6 in the six-layer Cu wiring process of the 90 nm node. A wiring width was similarly 3 μm, and outermost wiring of the inductor when viewed from an upper side of a base substrate 16 was similarly made so as to form a square measuring 120 μm on a side.

In FIGS. 1A and 1B, inductor wiring L1 has one roll of upper layer wiring and one roll of lower layer wiring. The upper layer wiring and the lower layer wiring are connected to each other in a via 2 at a point B. A terminal L1-IN is connected to the point A of the upper layer wiring via a leader line 3, and a terminal L1-OUT is connected to the point C of the lower layer wiring via a leader line 3. On the other hand, in FIG. 2, inductor wiring L1 has two rolls of upper layer wiring for connecting between a point A and a point B.

As can be seen from FIGS. 1A and 1B, the inductor according to the exemplary embodiment of the present invention is two rolls of inductor placed in an insulating film 17 formed on the base substrate 16 wherein the inductor has one go-around of go-around wiring formed in each of two adjacent wiring layers 18 of a plurality of wiring layers 18 in the insulating film 17, one end of the one go-around of go-around wiring formed in each of the two wiring layers 18 is connected to each other at a via 2, and the one go-around of go-around wiring formed in each of the two wiring layers 18 is placed at substantially the same position in a surface of the base substrate 16 when viewed from the upper side of the base substrate 16. On the other hand, an inductor of FIG. 2 is two rolls of planar inductor.

As can be seen by comparing FIGS. 1A, 1B and 2, the inductor according to the exemplary embodiment of the present invention has one go-around of go-around wiring formed in each of two adjacent wiring layers 18 of a plurality of wiring layers 18 in a six-layer Cu wiring process wherein one end of the one go-around of go-around wiring formed in each of the two wiring layers 18 is connected to each other at the via 2, and the one go-around of go-around wiring formed in each of the two wiring layers 18 is placed at substantially the same position in a surface of the base substrate 16 when viewed from the upper side of the base substrate 16. Thus, it is possible to improve area efficiency when viewed from the upper side of the base substrate 16 compared with the inductor of FIG. 2. For this reason, in the case where the number of turns of the inductor is improved in order to make an inductance value larger, the number of turns can be improved without making an area when viewed from the upper side of the base substrate 16 larger.

EXAMPLE 1

Figure 3A:
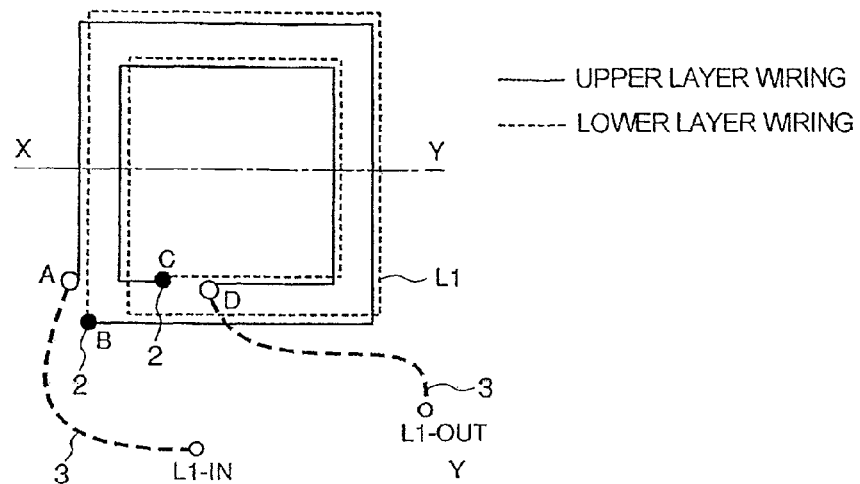
FIG. 3A is a plan view of an inductor according to Example 1 of the present invention.
Figure 3B:
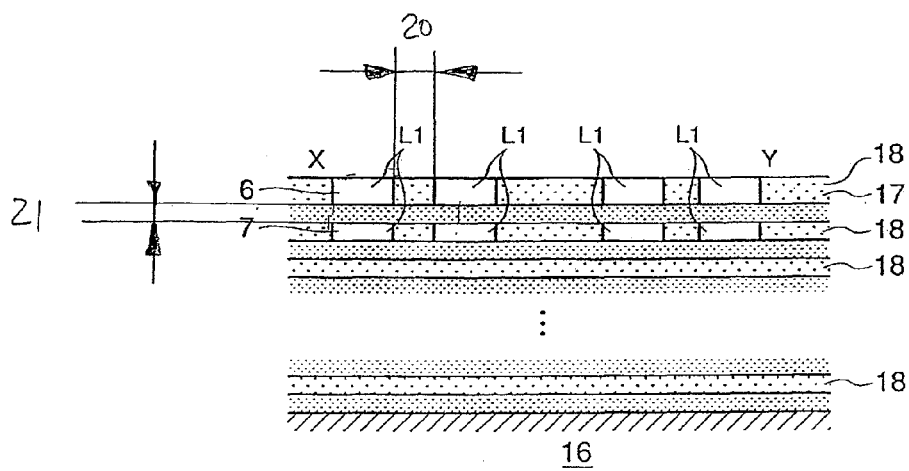
FIG. 3B is a sectional view taken along the X-Y line of FIG. 3A.

FIG. 3A is a plan view of an inductor according to Example 1 of the present invention when viewed from an upper side of a base substrate 16. FIG. 3B is a sectional view of the inductor according to Example 1 on the X-Y line of FIG. 3A when viewed from a side direction of the base substrate 16. The inductor according to the present example was manufactured using M5 wiring 6 and M4 wiring 7 of the next lower layer in a six-layer Cu wiring process of a 90 nm node, as well as "Best Mode for Carrying Out the Invention". A wiring width was 3 μm. Although an interlayer film thickness differs depending upon the wiring layer, an interlayer film thickness between the M5 wiring 6 and the M4 wiring 7 was about 0.3 μm. Outermost wiring of the inductor when viewed from the upper side of the base substrate 16 was made so as to form a square measuring 120 μm on a side.

Figure 4:
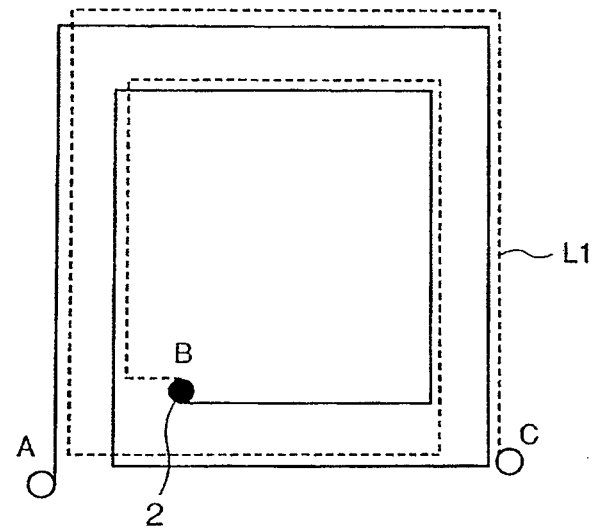
FIG. 4 is a plan view of a related inductor.

On the other hand, a related inductor shown in FIG. 4 was manufactured by the M5 wiring 6 in the six-layer Cu wiring process of the 90 nm node. A wiring width was similarly 3 μm, and outermost wiring of the inductor when viewed from an upper side of the base substrate 16 was similarly made so as to form a square measuring 120 μm on a side.

In FIGS. 3A and 3B, inductor wiring L1 has one roll of first upper layer wiring and two rolls of lower layer wiring connected to the first upper layer wiring in a via 2 at a point B. The inductor wiring L1 further has one roll of second upper layer wiring connected to the lower layer wiring in a via 2 at a point C. A terminal L1-IN is connected to the point A of the first upper layer wiring via a leader line 3, and a terminal L1-OUT is connected to a point D of the second upper layer wiring via a leader line 3. On the other hand, in FIG. 4, the inductor wiring L1 has two rolls of upper layer wiring for connecting between a point A and a point B and two rolls of lower layer wiring for connecting between the point B and a point C. The two rolls of upper layer wiring and the two rolls of lower layer wiring are connected to each other in a via 2 at the point B.

As can be seen from FIGS. 3A and 3B, the inductor according to the present invention is an inductor placed in an insulating film 17 formed on the base substrate 16 wherein the inductor has one go-around of go-around wiring formed in each of two adjacent wiring layers 18 of a plurality of wiring layers 18 in the insulating film 17, one end of the one go-around of go-around wiring formed in each of the two wiring layers 18 is connected to each other at the via 2, and the one go-around of go-around wiring formed in each of the two wiring layers 18 is placed at substantially the same position in a surface of the base substrate 16 when viewed from the upper side of the base substrate 16.

Further, the inductor according to the present invention has the one go-around of go-around wiring (lower layer wiring) when viewed from the upper side of the base substrate 16 and one go-around of another go-around wiring (lower layer wiring) connected to the other end of the one go-around of go-around wiring in any (lower layer wiring) of the two wiring layers. Namely, the one go-around of another go-around wiring (lower layer wiring) is placed inside the one go-around of go-around wiring (lower layer wiring) when viewed from the upper side of the base substrate 16. The one go-around of another go-around wiring (lower layer wiring) is also connected to one go-around of still another go-around wiring (upper layer wiring) at the via 2. The one go-around of another go-around wiring (lower layer wiring) and the one go-around of still another go-around wiring (upper layer wiring) are placed at substantially the same position in the surface of the base substrate 16 when viewed from the upper side of the base substrate 16. In FIG. 3A, a signal entering a terminal A goes around upper layer wiring once, goes down toward lower layer wiring at the point B, goes around the lower layer wiring twice, returns to the upper layer wiring from the point C, goes around the upper layer wiring once, and is outputted from the point D.

On the other hand, as can be seen from FIG. 4, in a structure of the related inductor, a signal entering from a terminal A goes around upper layer wiring twice, goes down toward lower layer wiring at the point B, goes around lower layer wiring twice, and is outputted from the point C.

Figure 5:
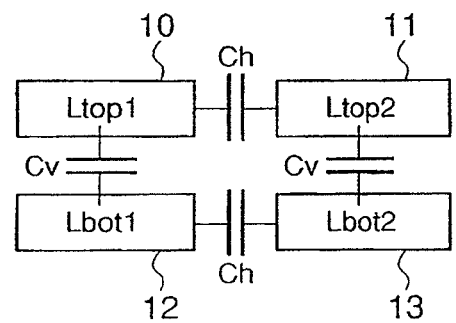
FIG. 5 is a view for explaining a cross section of inductor wiring.

FIG. 5 is a view for explaining a cross section of general on-chip inductor wiring. In FIG. 5, parasitic capacitances Ch14, Cv15 exist between upper layer wirings Ltop1 10 and Ltop2 11 and between lower layer wirings Lbot1 12 and Lbot2 13, respectively. Here, a Ch is a capacity between right and left wirings, and a Cv is a capacity between upper and lower wirings. Here, in each wiring, a wiring width is larger than a wiring film thickness, and a wiring interval is wider than an interlayer film thickness of the wiring. This becomes Cv>>Ch. Namely, parasitic capacitance of inductor wiring is dominant between the upper and lower adjacent wirings rather than between the right and left adjacent wirings.

Figure 6A:
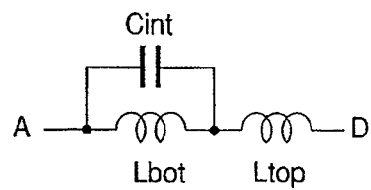
FIG. 6A is a view for explaining parasitic capacitance of the inductor according to Example 1.
Figure 6B:
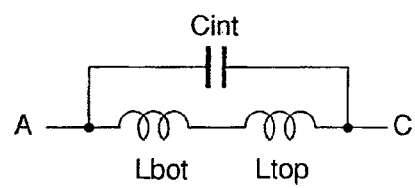
FIG. 6B is a view for explaining parasitic capacitance of the related inductor of FIG. 4.

FIGS. 6A and 6B respectively show states of parasitic capacitance of the inductor of the present example (FIGS. 3A and 3B) and the related inductor (FIG. 4). An Lbot indicates inductance of the lower layer wiring, and an Ltop indicates inductance of the upper layer wiring. In the case of the inductor according to the present example of FIG. 6A, a signal passing through the wiring passes through lower wiring when it goes around once. Therefore, it can be modeled that a Cint is connected to both sides of the Lbot. For this reason, since the Cint is not directly seen from the terminals A to D, an influence of this capacity Cint is reduced. On the other hand, in the case of the related inductor (FIG. 4) of FIG. 6B, a signal passing through the wiring moves toward the lower wiring after it terminates to go around the layer. For this reason, it becomes a model so that the Cint is directly coupled to the terminals A to C. For this reason, an influence of the Cint appears largely. As described above, the inductor according to the present invention can reduce parasitic capacitance of the wiring.

Figure 7:
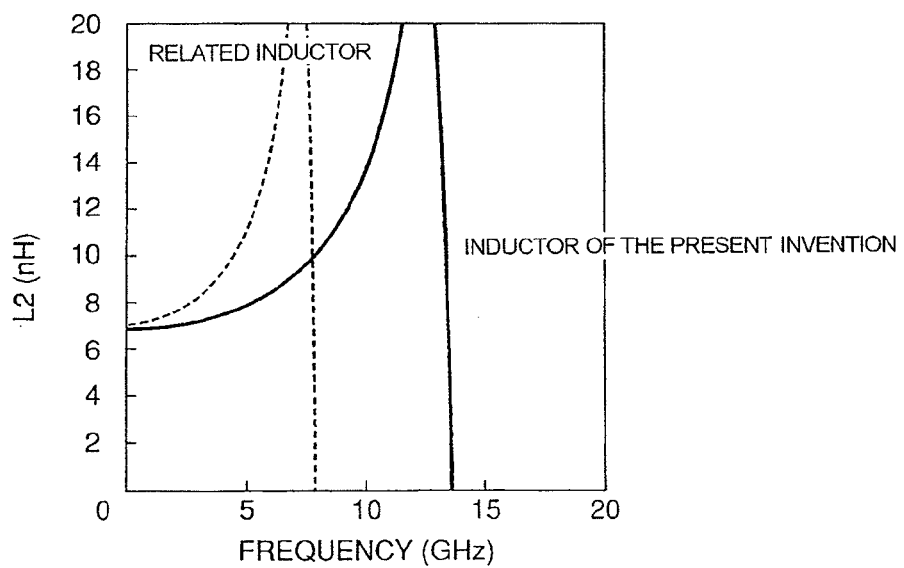
FIG. 7 is a view showing a simulation result of parasitic capacitances of the inductor of the present invention and the related inductor of FIG. 4.

In order to demonstrate effects of the present invention, characteristics of the inductor according to the present invention and related inductor (FIG. 4) were examined by a three-dimensional electromagnetic field simulation. Here, FIG. 7 shows a result obtained by carrying out a three-dimensional electromagnetic field simulation using the respective conditions used as the manufacturing process, that is, the M5 wiring 6 and the M4 wiring 7 in the six-layer Cu wiring process of the 90 nm node, a wiring width of 3 μm, an interlayer film thickness of 0.3 μm, and outermost wiring of the inductor when viewed from the upper side of the base substrate 16 being a square measuring 120 μm on a side. As can be seen from FIG. 7, since the inductor according to the present invention can reduce parasitic capacitance compared with the related inductor (FIG. 4), an inductance value is positive up to a high frequency, that is, it can be seen to function as an inductor. Here, an effect to reduce the parasitic capacitance has been examined with a shape of outermost wiring of the inductor being a square measuring 120 μm on a side. The effect of the present invention is obtained markedly as a size of the inductor is miniaturized.

EXAMPLE 2

Figure 8A:
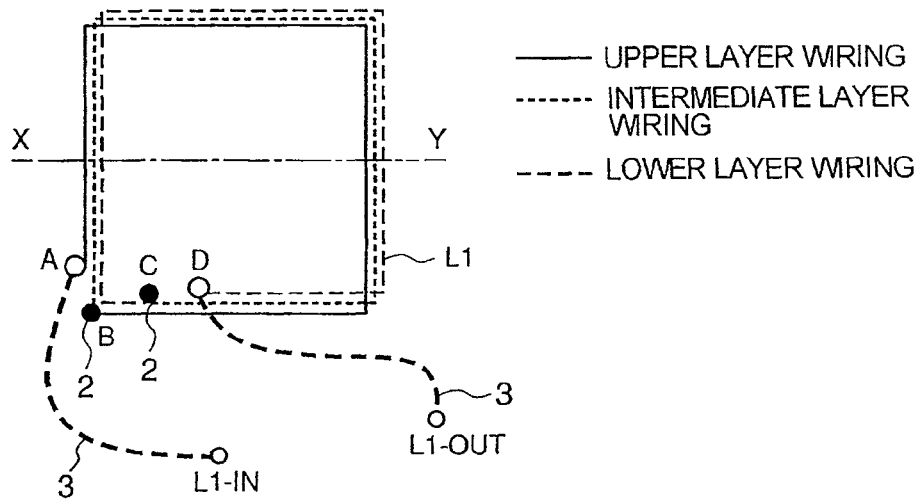
FIG. 8A is a plan view of an inductor according to Example 2 of the present invention.
Figure 8B:
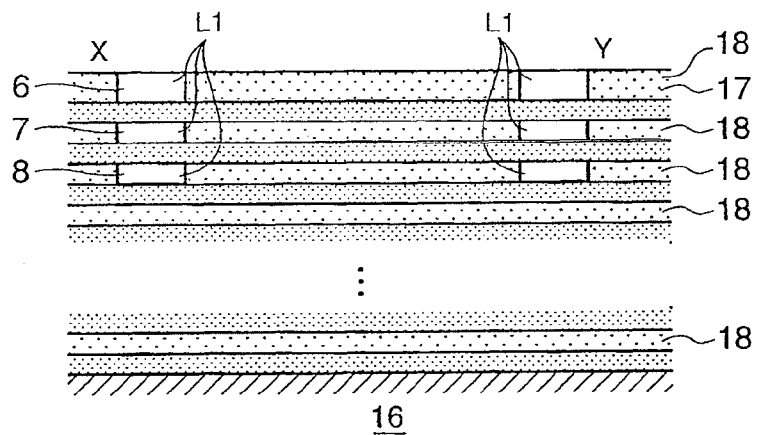
FIG. 8B is a sectional view taken along the X-Y line of FIG. 8A.

FIG. 8A is a plan view of an inductor according to Example 2 of the present invention when viewed from an upper side of a base substrate 16. FIG. 8B is a sectional view of the inductor according to Example 2 on the X-Y line of FIG. 8A when viewed from a side direction of the base substrate 16. The inductor of Example 2 was manufactured using M5 wiring 6, M4 wiring 7 of the next lower layer and M3 wiring 8 of the next lower layer in a six-layer Cu wiring process of a 90 nm node. A wiring width was 3 μm. Each interlayer film thickness was about 0.3 μm. Outermost wiring of the inductor when viewed from the upper side of the base substrate 16 was made so as to form a square measuring 120 μm on a side.

In FIGS. 8A and 8B, inductor wiring L1 has one roll of upper layer wiring and one roll of intermediate layer wiring connected to the upper layer wiring in a via 2 at a point B. Moreover, the inductor wiring L1 has one roll of lower layer wiring connected to the intermediate layer wiring in a via 2 at a point C. A terminal L1-IN is connected to the point A of the upper layer wiring via a leader line 3, and a terminal L1-OUT is connected to a point D of the lower layer wiring via a leader line 3.

As can be seen from FIGS. 8A and 8B, the inductor according to the present invention is an inductor placed in an insulating film 17 formed on the base substrate 16 wherein the inductor has one go-around of go-around wiring formed in each of two adjacent wiring layers (upper layer wiring and intermediate layer wiring) 18 of a plurality of wiring layers 18 in the insulating film 17, one end of the one go-around of go-around wiring formed in each of the two wiring layers 18 is connected to each other at the via 2, and the one go-around of go-around wiring formed in each of the two wiring layers 18 is placed at substantially the same position in a surface of the base substrate 16 when viewed from the upper side of the base substrate 16.

Further, in the inductor according to the present invention, one go-around of go-around wiring when viewed from the upper side of the base substrate 16 is also connected to the one go-around of go-around wiring formed in any (intermediate layer wiring) of the two wiring layers 18 in the via 2 at the point C in the wiring layer (lower layer wiring) 18 of a lower layer of the two wiring layers. The one go-around of go-around wiring of the wiring layer (lower layer wiring) 18 of the lower layer of the two wiring layers and the one go-around of go-around wiring formed in each of the two wiring layers (upper layer wiring and intermediate layer wiring) 18 are placed at substantially the same position in the surface of the base substrate 16 when viewed from the upper side of the base substrate 16. In the present example, another go-around wiring is not placed inside the one go-around of go-around wiring when viewed from the upper side of the base substrate 16. In FIG. 8A, a signal entering a terminal A goes around upper layer wiring once, goes down toward intermediate layer wiring at the point B, goes around the intermediate layer wiring once, goes down toward further lower layer wiring from the point C, goes around the lower layer wiring once, and is outputted from the point D.

Figure 9:
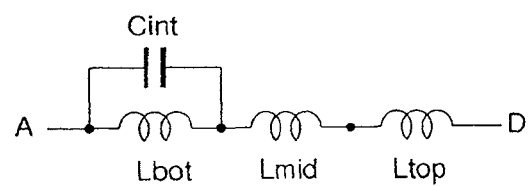
FIG. 9 is a view for explaining parasitic capacitance of the inductor according to Example 2.

FIG. 9 shows a state of parasitic capacitance of the inductor according to the present example. An Lbot indicates inductance of the lower layer wiring, an Lmid indicates inductance of the intermediate layer wiring, and an Ltop indicates inductance of the upper layer wiring. In the case of the inductor of FIGS. 8A and 8B according to the present example, a signal passing through the wiring passes through the lower wiring when it goes around once. Therefore, it can be modeled that a Cint is connected to both sides of the Lbot. For this reason, since the Cint is not directly seen from the terminals A to D, an influence of this capacity is reduced. For this reason, the inductor according to the present invention can reduce parasitic capacitance of the wiring by means of the similar mechanism to that of the inductor according to Example 1.

EXAMPLE 3

Figure 10A:
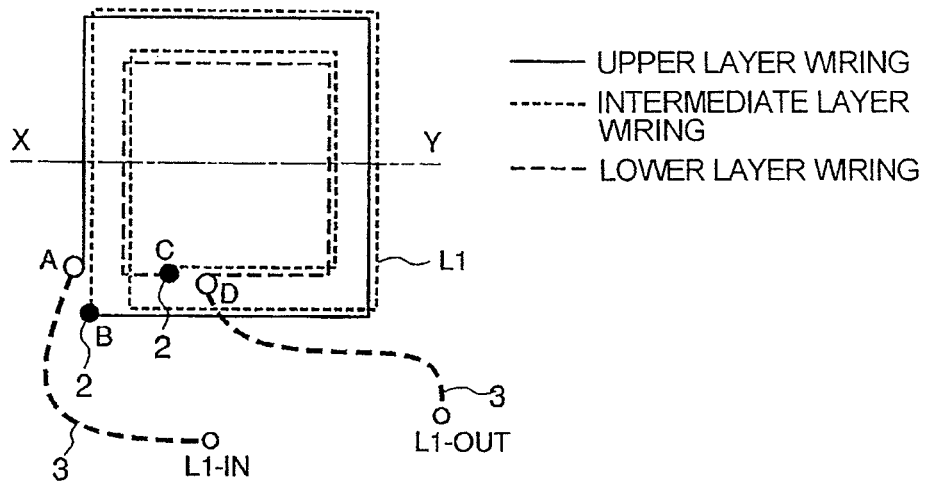
FIG. 10A is a plan view of an inductor according to Example 3 of the present invention.
Figure 10B:
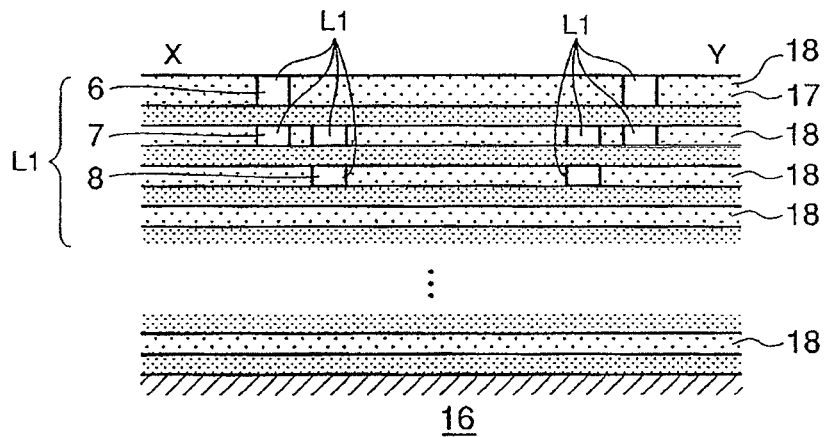
FIG. 10B is a sectional view taken along the X-Y line of FIG. 10A.

FIG. 10A is a plan view of an inductor according to Example 3 of the present invention when viewed from an upper side of a base substrate 16. FIG. 10B is a sectional view of the inductor according to Example 3 on the X-Y line of FIG. 10A when viewed from a side direction of the base substrate 16. The inductor according to Example 3 was manufactured by the similar process to that in Example 2. Outermost wiring of the inductor when viewed from the upper side of the base substrate 16 was similarly made so as to form a square measuring 120 μm on a side.

In FIGS. 10A and 10B, inductor wiring L1 has one roll of upper layer wiring and two rolls of intermediate layer wiring connected to the upper layer wiring in a via 2 at a point B. Moreover, the inductor wiring L1 has one roll of lower layer wiring connected to the intermediate layer wiring in a via 2 at a point C. A terminal L1-IN is connected to a point A of the upper layer wiring via a leader line 3, and a terminal L1-OUT is connected to a point D of the lower layer wiring via a leader line 3.

As can be seen from FIGS. 10A and 10B, the inductor according to the present invention is an inductor placed in an insulating film 17 formed on a base substrate 16 wherein the inductor has one go-around of go-around wiring formed in each of two adjacent wiring layers (upper layer wiring and intermediate layer wiring) 18 of a plurality of wiring layers 18 in the insulating film 17, one end of the one go-around of go-around wiring formed in each of the two wiring layers 18 is connected to each other at a via 2, and the one go-around of go-around wiring formed in each of the two wiring layers 18 is placed at substantially the same position in a surface of the base substrate 16 when viewed from the upper side of the base substrate 16.

Further, the inductor according to the present invention has the one go-around of go-around wiring (intermediate layer wiring) when viewed from the upper side of the base substrate 16 and one go-around of another go-around wiring (intermediate layer wiring) connected to the other end of the one go-around of go-around wiring in any (intermediate layer wiring) of the two wiring layers. Namely, the one go-around of another go-around wiring (intermediate layer wiring) is placed inside the one go-around of go-around wiring (intermediate layer wiring) when viewed from the upper side of the base substrate 16. The one go-around of another go-around wiring (intermediate layer wiring) is also connected to one go-around of still another go-around wiring (lower layer wiring) in the via 2 at the point C. The one go-around of another go-around wiring (intermediate layer wiring) and the one go-around of still another go-around wiring (lower layer wiring) are placed at substantially the same position in the surface of the base substrate 16 when viewed from the upper side of the base substrate 16.

To put it all together, a signal entering from the terminal A of the first inductor first goes around upper layer wiring once, goes down toward intermediate layer wiring to go around the intermediate layer wiring twice, goes down toward lower layer wiring, and is outputted from the point D. Here, the go-around wiring outside the intermediate layer wiring and the upper layer wiring are placed at substantially the same position when viewed from the upper side of the base substrate 16, and the go-around wiring of the lower layer wiring and the go-around wiring inside the intermediate layer wiring are placed at substantially the same position when viewed from the upper side of the base substrate 16. Here, although the case where the number of wiring layers spending for the L1 is three layers has been explained, the case where the number of wiring layers spending the L1 is three layers or more is also constructed similarly.

Figure 11:
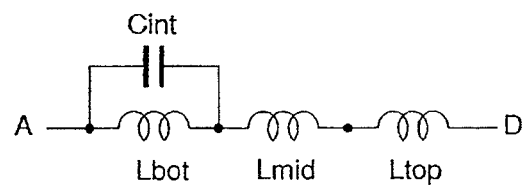
FIG. 11 is a view for explaining parasitic capacitance of the inductor according to Example 3.

FIG. 11 shows a state of parasitic capacitance of the inductor according to the present example. An Lbot indicates inductance of the lower layer wiring, an Lmid indicates inductance of the intermediate layer wiring, and an Ltop indicates inductance of the upper layer wiring. In the case of the inductor of FIGS. 10A and 10B according to the present example, a signal passing through the wiring passes through the lower wiring when it goes around once. Therefore, it can be modeled that a Cint is connected to both sides of the Lbot. For this reason, since the Cint is not directly seen from the terminals A to D, an influence of this capacity is reduced. For this reason, the inductor according to the present invention can reduce parasitic capacitance of the wiring by means of the similar mechanism to those of the inductors according to Examples 1, 2.

EXAMPLE 4

Figure 12A:
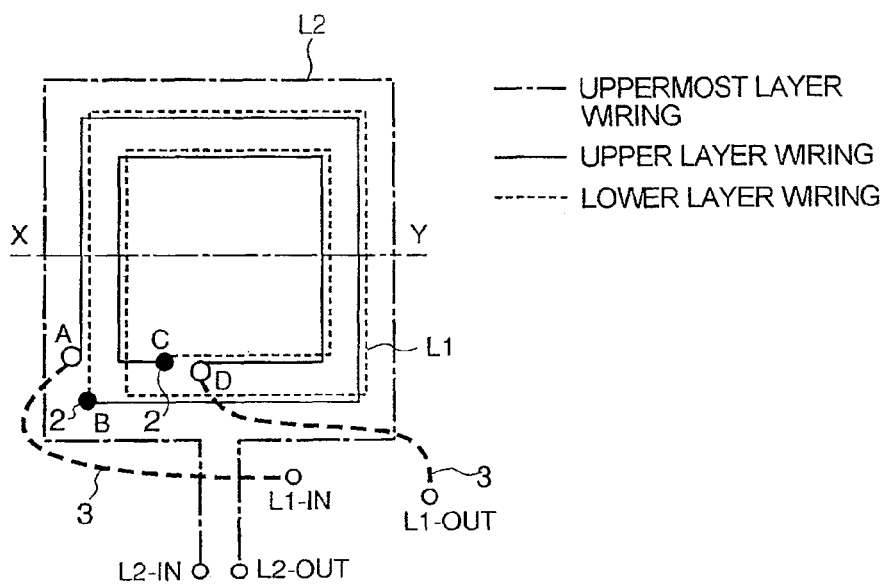
FIG. 12A is a plan view of an inductor according to Example 4 of the present invention.
Figure 12B:
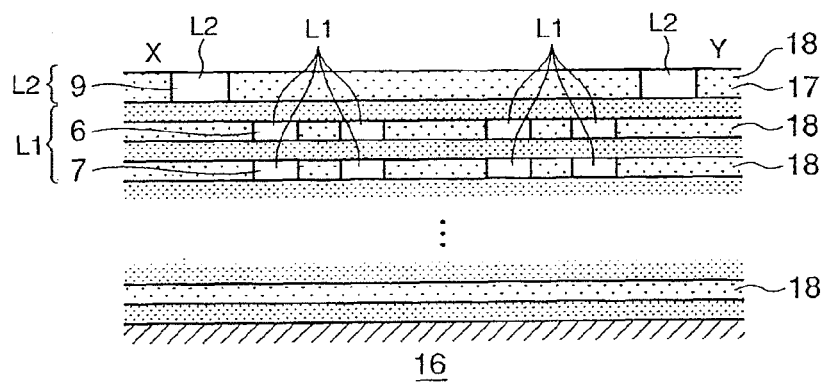
FIG. 12B is a sectional view taken along the X-Y line of FIG. 12A.

FIG. 12A is a plan view of an inductor according to Example 4 of the present invention when viewed from an upper side of a base substrate 16. FIG. 12B is a sectional view of the inductor according to Example 4 on the X-Y line of FIG. 12A when viewed from a side direction of the base substrate 16. As can be seen from FIGS. 12A and 12B, the inductor according to the present example is constructed so that a second inductor L2 is further placed outside an inductor (hereinafter, referred to as a "first inductor") L1 with a configuration of Example 1 (FIGS. 3A and 3B) when viewed from an upper side of the base substrate 16, and the first inductor L1 and the second inductor L2 are magnetically coupled.

The inductor according to the present example was manufactured using a six-layer Cu wiring process of a 90 nm node. The second inductor L2 was manufactured using M6 wiring 9 of an uppermost layer, and the first inductor L1 was manufactured using M5 wiring 6 and M4 wiring 7 of the next lower layer. A wiring width of the M6 wiring 9 was 10 µm, and a wiring width of each of the M5 wiring 6 and the M4 wiring 7 was 3 µm. Interlayer film thicknesses were respectively about 0.9 µm between the M6 wiring 9 and the M5 wiring 6 and about 0.3 µm between the M5 wiring 6 and the M4 wiring 7. Outermost wiring of the first inductor L1 when viewed from the upper side of the base substrate 16 was made so as to form a square measuring 120 µm on a side, and the second inductor L2 was provided outside it.

Namely, in FIGS. 12A and 12B, inductor wiring L2 is provided outside inductor wiring L1 with the similar structure to that in Example 1 (FIGS. 3A and 3B). This inductor wiring L2 has one roll of uppermost layer wiring for connecting between a terminal L2-IN and a terminal L2-OUT.

Figure 13:
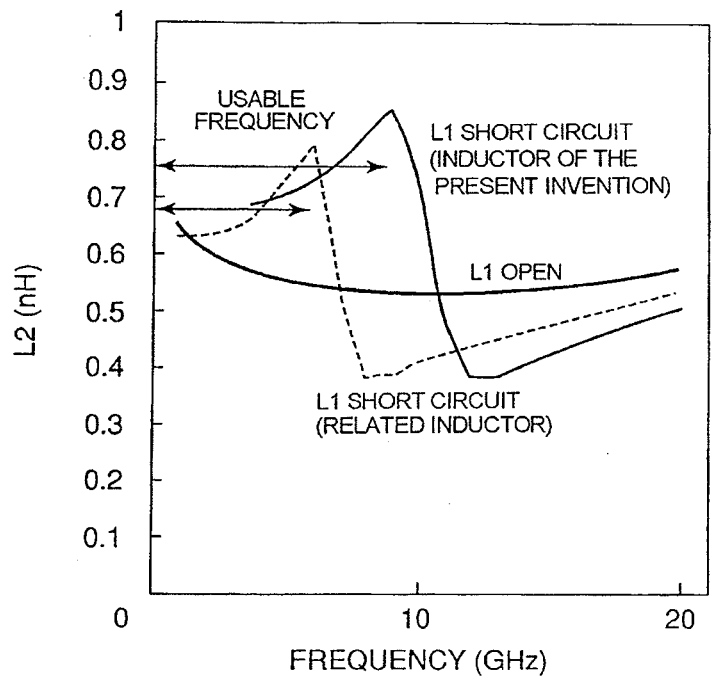
FIG. 13 is a view showing a simulation result of an inductance value of the inductor according to Example 4.
Figure 14:
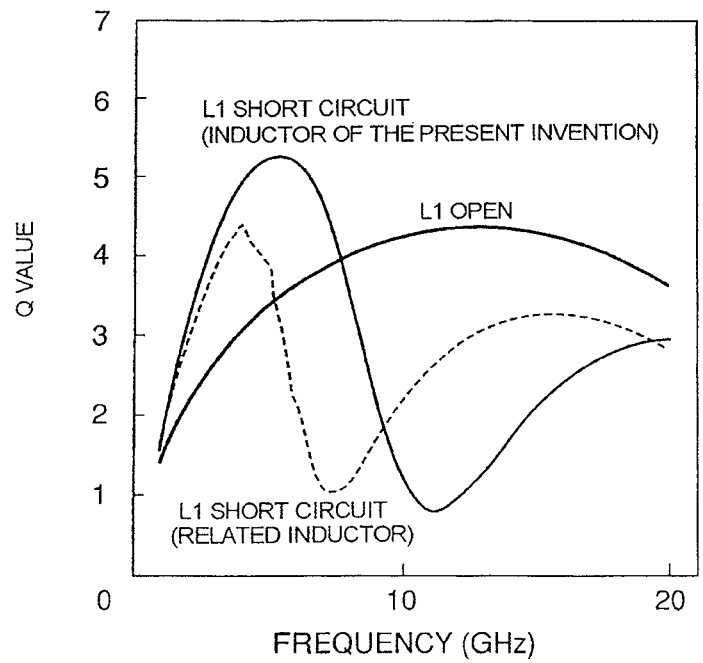
FIG. 14 is a view showing a simulation result of a Q value and a self-resonant frequency of the inductor according to Example 4.

FIG. 13 shows a result obtained by examining characteristics of the inductor according to Example 4 with a three-dimensional electromagnetic field simulation using the above conditions used as the manufacturing process in order to demonstrate the effects of the present invention. In this regard, the L2 goes around twice here. FIGS. 13 and 14 show an inductance value and a Q value of a secondary side L2 when to short and open a terminal of the inductor of a primary side L1. The case where the related inductor of FIG. 4 is used at the L1 side is shown as a comparative example. As can be seen from FIGS. 13 and 14, it can be seen that the characteristics of the inductor according to the present invention when to open the L1 differ little from those of the related inductor (FIG. 4), but, when to short the L1, the inductor according to the present invention can obtain a wider variable band, a higher Q value and a higher self-resonant frequency (the frequency at which the Q value becomes 0) than the related inductor (FIG. 4). Thus, the inductor according to the present invention can improve the characteristics of the inductor by reducing parasitic capacitance.

In this regard, although the present example is an example in which the second inductor L2 is provided outside the first inductor L1 when viewed from the upper side of the base substrate 16, the second inductor L2 may be coupled to the first inductor L1 magnetically, necessarily and sufficiently. For this reason, a position of the second inductor L2 is not limited to this, and the second inductor L2 may be at substantially the same position as that of the first inductor L1 when viewed from the upper side of the base substrate 16, or may be inside the first inductor L1.

In this regard, generally, when it is assumed that self-inductances of the first and second inductors L1 and L2 respectively denote L1 and L2, a mutual inductance between the L1 and the L2 denotes M, and series resistances of the first and second inductors L1 and L2 respectively denote R1 and R2, inductance and series resistance when viewed from both sides of the L2 are expressed as follows.

Namely, the inductance is expressed by:

$$L2(1-k^2). \quad (1)$$

The series resistance is expressed by:

$$R2+k^2(L2/L1). \quad (2)$$

Here, k is coupling constant, and is $$k=M/\{(L1L2)^{1/2}\}. \quad (3)$$

where k indicates the degree of coupling of L1 and L2 of trans, and takes a value from 0 to 1.

When the series resistance when viewed from both sides of the L2 side becomes larger, a problem of a phase noise becomes obvious. Thus, it is desirable that the series resistance is kept low as much as possible. In order to reduce the series resistance, as is apparent from the expression (2), the L1 may be made larger compared with the L2. Namely, the number of turns of the L1 may be increased. Alternatively, the R2 may be reduced.

Since the inductor according to the present invention uses a multilayer wiring layer in the insulating film formed on the base substrate 16, it is easy to increase the number of turns of the inductor without making a device size large. For this reason, in order to reduce a phase noise, the number of turns of the L1 of FIGS. 12A and 12B should be increased as much as possible by taking advantage of a merit of multilayer wiring.

Further, by forming the inductor of the L2 of the wiring layer with the thickest film thickness, the R2 can be reduced. This makes it possible to restrain a phase noise. For this reason, it is desirable that the inductor of the L2 is formed of a wiring layer with as small wiring resistance as possible, preferably of a wiring layer with the thickest film thickness used in the process, the L1 is formed of a wiring layer other than the wiring layer of the thickest film thickness. In the normal process, the thickest film thickness layer is formed at the uppermost layer.

Moreover, in order to reduce series resistance when viewed from both sides of the L2 side, it is preferable that a wiring width of the L2 is a wiring width of the L1 or wider. In a normal process, a wiring width of the thickest film thickness layer is larger than a wiring width of a film thickness layer with thinner film thickness than it. Therefore, in the case where the inductor of the L2 is formed of the wiring layer with the thickest film thickness, this condition is met.

EXAMPLE 5

Figure 15A:
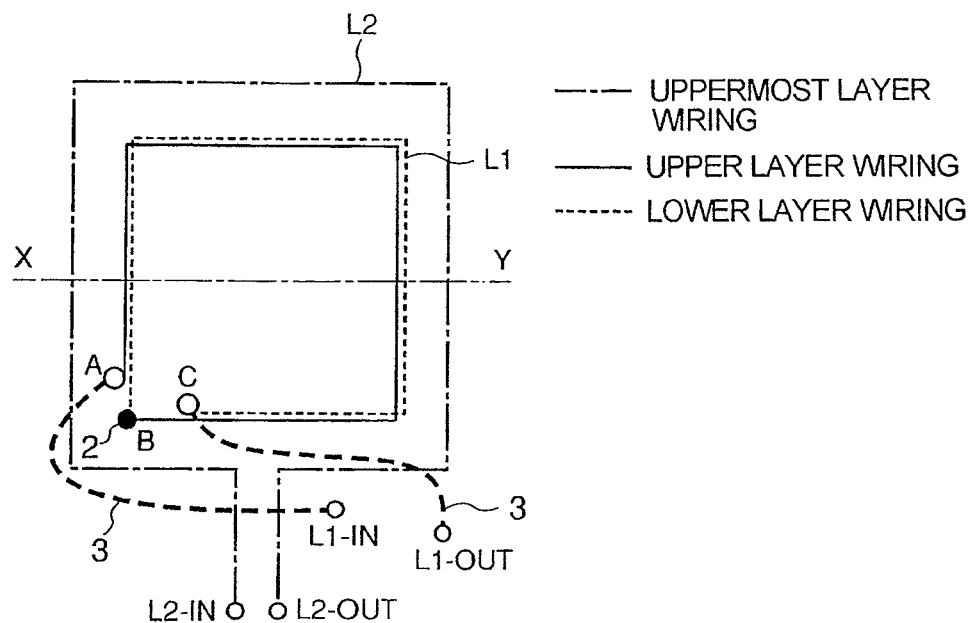
FIG. 15A is a plan view of an inductor according to Example 5 of the present invention.
Figure 15B:
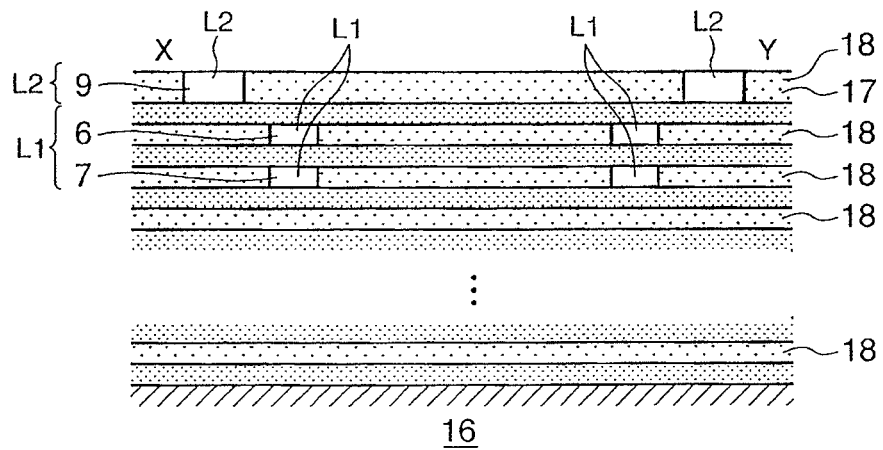
FIG. 15B is a sectional view taken along the X-Y line of FIG. 15A.

FIG. 15A is a plan view of an inductor according to Example 5 of the present invention when viewed from an upper side of a base substrate 16. FIG. 15B is a sectional view of the inductor according to Example 5 on the X-Y line of FIG. 15A when viewed from a side direction of the base substrate 16. As can be seen from FIGS. 15A and 15B, the inductor according to the present example is one wherein a second inductor L2 is further provided outside an inductor (hereinafter, referred to as a "first inductor") L1 with the configuration of FIGS. 1A and 1B when viewed from an upper side of the base substrate 16, and the first inductor L1 and the second inductor L2 are magnetically coupled.

The inductor according to the present example was manufactured using a six-layer Cu wiring process of a 90 nm node. The second inductor L2 was manufactured using M6 wiring 9 of an uppermost layer, and the first inductor L1 was manufactured using M5 wiring 6 and M4 wiring 7 of the next lower layer. A wiring width of the M6 wiring 9 was 10 µm, and a wiring width of each of the M5 wiring 6 and the M4 wiring 7 was 3 µm. An interlayer film thickness between the M6 wiring 9 and the M5 wiring 6 was about 0.9 µm, and an interlayer film thickness between the M5 wiring 6 and the M4 wiring 7 was about 0.3 µm. Outermost wiring of the first inductor L1 when viewed from the upper side of the base substrate 16 was made so as to form a square measuring 120 µm on a side, and the second inductor L2 was provided outside it.

Namely, in FIGS. 15A and 15B, inductor wiring L2 is provided outside inductor wiring L1 with the similar structure to that in FIGS. 1A and 1B. This inductor wiring L2 has one roll of uppermost layer wiring for connecting between a terminal L2-IN and a terminal L2-OUT.

As is made apparent by the inductor shown in FIGS. 1A and 1B, since the first inductor L1 can reduce parasitic capacitance between upper and lower wiring layers, the inductor according to the present invention can obtain a high Q value and a high self-resonant frequency when to short the L1 by means of the similar mechanism to that in Example 4. Thus, the inductor according to the present invention can improve characteristics of the inductor by reducing the parasitic capacitance between upper and lower wirings.

In this regard, as well as the case of Example 4, in the case of the present example, the second inductor L2 may be at substantially the same position as that of the first inductor L1 when viewed from the upper side of the base substrate 16, or may be inside the first inductor L1.

EXAMPLE 6

Figure 16A:
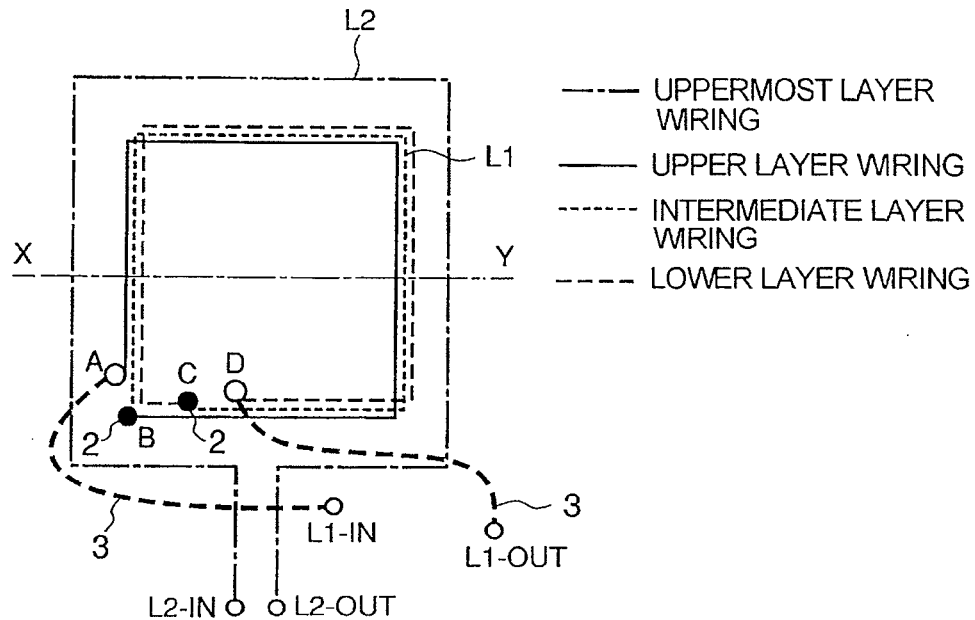
FIG. 16A is a plan view of an inductor according to Example 6 of the present invention.
Figure 16B:
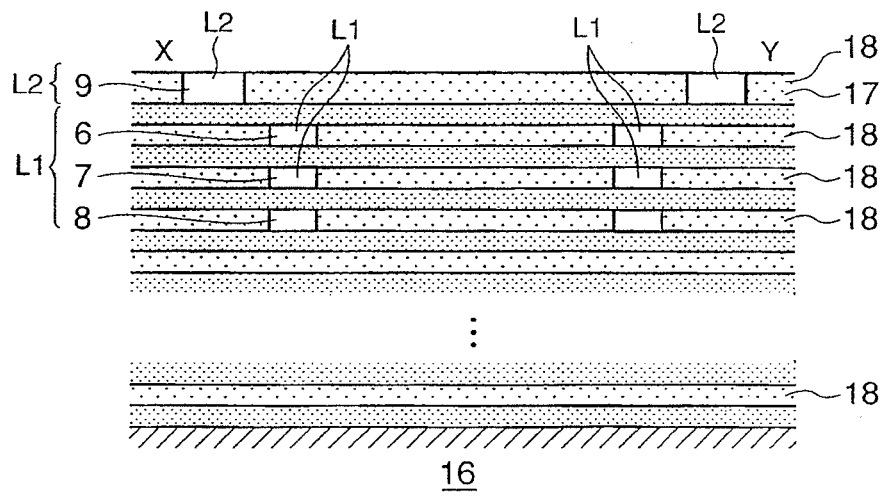
FIG. 16B is a sectional view taken along the X-Y line of FIG. 16A.

FIG. 16A is a plan view of an inductor according to Example 6 of the present invention when viewed from an upper side of a base substrate 16. FIG. 16B is a sectional view of the inductor according to Example 6 on the X-Y line of FIG. 16A when viewed from a side direction of the base substrate 16. As can be seen from FIGS. 16A and 16B, the inductor according to the present example is one wherein a second inductor L2 is further provided outside an inductor (hereinafter, referred to as a "first inductor") L1 with the configuration of Example 2 (FIGS. 8A and 8B) when viewed from an upper side of the base substrate 16, and the first inductor L1 and the second inductor L2 are magnetically coupled.

The inductor according to the present example was manufactured using a six-layer Cu wiring process of a 90 nm node. The second inductor L2 was manufactured using M6 wiring 9 of an uppermost layer, and the first inductor L1 was manufactured using M5 wiring 6, M4 wiring 7 of the next lower layer and M3 wiring 8 of the next lower layer. A wiring width of the M6 wiring 9 was 10 μm, and a wiring width of each of the M5 wiring 6, the M4 wiring 7 and the M3 wiring 8 was 3 μm. An interlayer film thickness between the M6 wiring 9 and the M5 wiring 6 was about 0.9 μm, and each of an interlayer film thickness between the M5 wiring 6 and the M4 wiring 7 and an interlayer film thickness between the M4 wiring 7 and the M3 wiring 8 was about 0.3 μm. Outermost wiring of the first inductor L1 when viewed from the upper side of the base substrate 16 was made so as to form a square measuring 120 μm on a side, and the second inductor L2 was provided outside it.

Namely, in FIGS. 16A and 16B, inductor wiring L2 is provided outside inductor wiring L1 with the similar structure to that in FIGS. 8A and 8B. This inductor wiring L2 has one roll of uppermost layer wiring for connecting between a terminal L2-IN and a terminal L2-OUT.

As is clear by Example 2 (FIGS. 8A and 8B), since the first inductor L1 can reduce parasitic capacitance between upper and lower wiring layers, the inductor according to the present invention can obtain a high Q value and a high self-resonant frequency when to short the L1 by means of the similar mechanism to that in Example 4. Thus, the inductor according to the present invention can improve characteristics of the inductor by reducing the parasitic capacitance between upper and lower wirings.

In this regard, as well as the cases of Examples 4 and 5, in the case of the present example, the second inductor L2 may be at substantially the same position as that of the first inductor L1 when viewed from the upper side of the base substrate 16, or may be inside the first inductor L1.

Moreover, as well as the case of Example 4, in order to reduce series resistance when viewed from both sides of the L2 side, the number of turns of the L1 should be increased as much as possible by taking advantage of a merit of multilayer wiring. Further, in order to reduce the series resistance, it is preferable that the L2 is formed in a wiring layer of the thickest film thickness layer, the L1 is formed in a wiring layer other than the thickest film thickness layer, and a wiring width of the L2 is a wiring width of the L1 or wider. This makes it possible to restrain a phase noise from occurring more effectively.

EXAMPLE 7

Figure 17A:
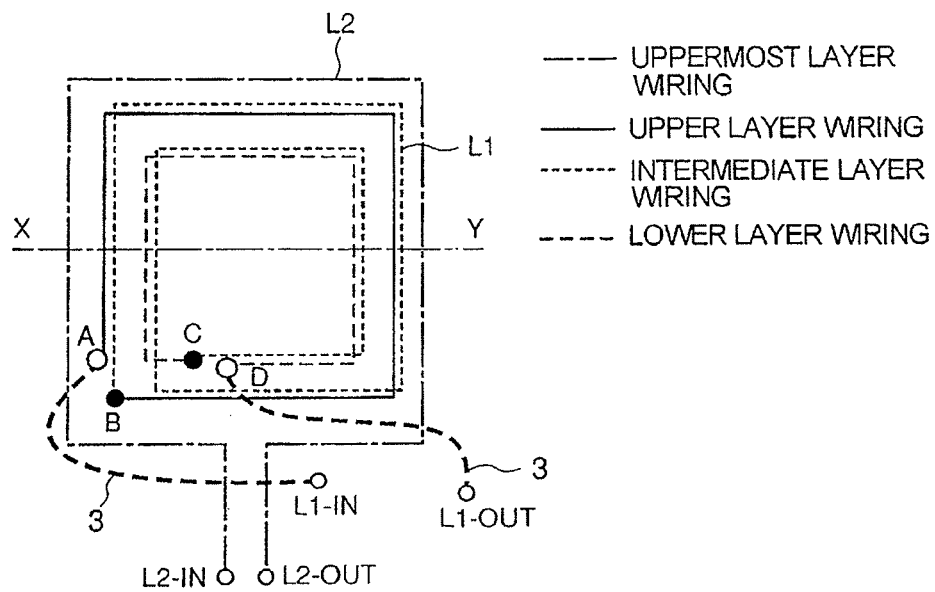
FIG. 17A is a plan view of an inductor according to Example 7 of the present invention.
Figure 17B:
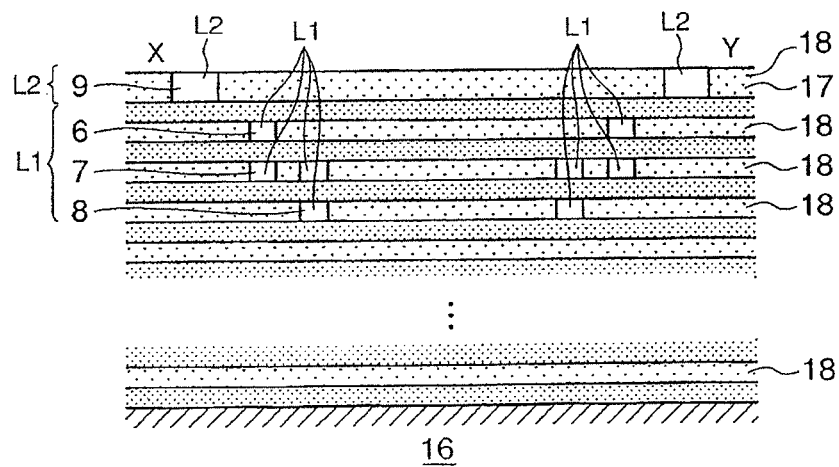
FIG. 17B is a sectional view taken along the X-Y line of FIG. 17A.

FIG. 17A is a plan view of an inductor according to Example 7 of the present invention when viewed from an upper side of a base substrate 16. FIG. 17B is a sectional view of the inductor according to Example 7 on the X-Y line of FIG. 17A when viewed from a side direction of the base substrate 16. As can be seen from FIGS. 17A and 17B, the inductor according to Example 7 is one wherein a second inductor L2 is further provided outside an inductor (hereinafter, referred to as a "first inductor") L1 with the configuration of Example 3 (FIGS. 10A and 10B) when viewed from an upper side of the base substrate 16, and the first inductor L1 and the second inductor L2 are magnetically coupled.

The inductor according to the present example was manufactured using a six-layer Cu wiring process of a 90 nm node. The second inductor L2 was manufactured using M6 wiring 9 of an uppermost layer, and the first inductor L1 was manufactured using M5 wiring 6, M4 wiring 7 of the next lower layer and M3 wiring 8 of the next lower layer. A wiring width of the M6 wiring 9 was 10 μm, and a wiring width of each of the M5 wiring 6, the M4 wiring 7 and the M3 wiring 8 was 3 μm. An interlayer film thickness between the M6 wiring 9 and the M5 wiring 6 was about 0.9 μm, and each of an interlayer film thickness between the M5 wiring 6 and the M4 wiring 7 and an interlayer film thickness between the M4 wiring 7 and the M3 wiring 8 was about 0.3 μm. Outermost wiring of the first inductor L1 when viewed from the upper side of the base substrate 16 was made so as to form a square measuring 120 μm on a side, and the second inductor L2 was provided outside it.

As is clear from Example 3 (FIGS. 10A and 10B), since the first inductor L1 can reduce parasitic capacitance between upper and lower wiring layers, the inductor according to the present invention can obtain a high Q value and a high self-resonant frequency when to short the L1 by means of the similar mechanism to that in Example 4. Thus, the inductor according to the present invention can improve characteristics of the inductor by reducing the parasitic capacitance between the upper and lower wirings.

In this regard, as well as the cases of Examples 4 to 6, in the case of the present example, the second inductor L2 may be at substantially the same position as that of the first inductor L1 when viewed from the upper side of the base substrate 16, or may be inside the first inductor L1.

Moreover, as well as the case of Example 4, in order to reduce series resistance when viewed from both sides of the L2 side, the number of turns of the L1 should be increased as much as possible by taking advantage of a merit of multilayer wiring. Further, in order to reduce the series resistance, it is desirable that the L2 is formed in a wiring layer of the thickest film thickness layer, the L1 is formed in a wiring layer other than the thickest film thickness layer, and a wiring width of the L2 is a wiring width of the L1 or wider. This makes it possible to restrain a phase noise from occurring more effectively.

EXAMPLE 8

Figure 18:
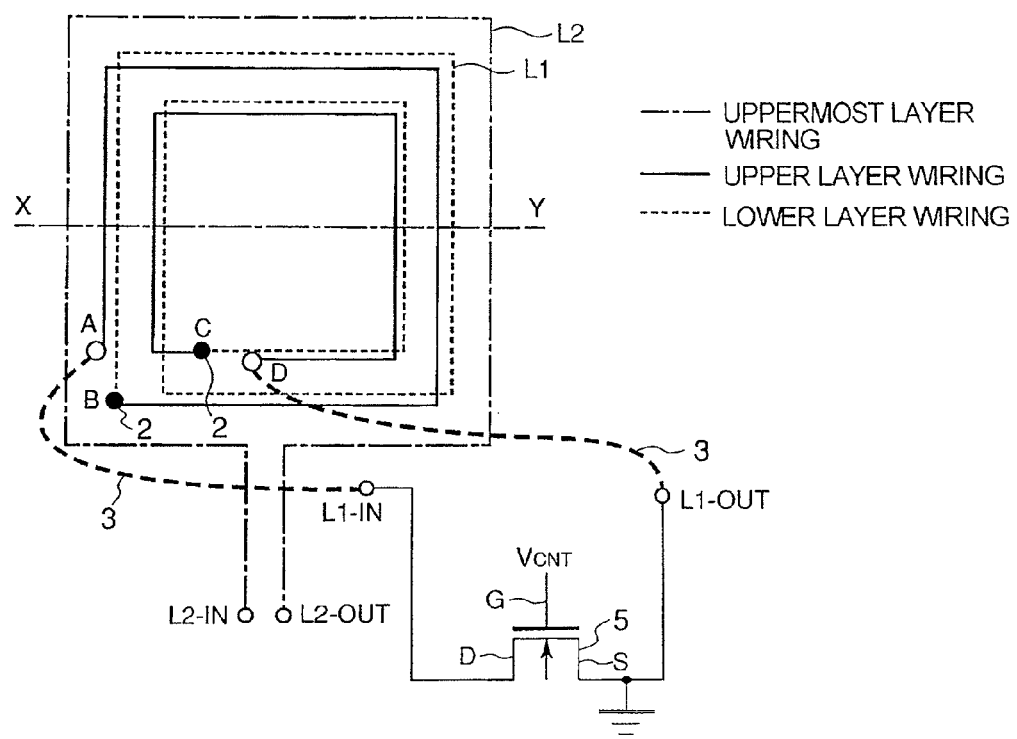
FIG. 18 is a view for explaining an inductor according to Example 8 of the present invention.
Figure 19:
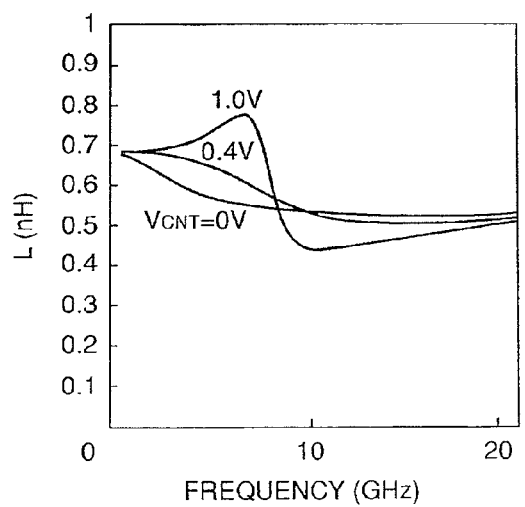
FIG. 19 is a view showing an inductance value according to Example 8 of the present invention.

In Example 8 of the present invention, as shown in FIG. 18, a source terminal S and a drain terminal D of an n type MISFET 5 were respectively connected to both terminals L1-IN and L1-OUT connected to a start point AL1-IN and an end point D of an L1 of the inductor of Example 4 (FIGS. 12A and 12B). The source terminal S is fixed at ground potential. Gate voltage Vcnt is applied to a gate terminal G of the n type MISFET 5. This makes it possible to prevent a noise due to indefiniteness of electric potential of the inductor. Here, the element to be connected to the L1 may be not only an n type, but also a p type. Further, the n type and the p type may be connected in parallel. Moreover, it may be not only a MISFET (Metal Insulator Semiconductor Field Effect Transistor), but also a MESFET (MEtal Insulator Semiconductor Field Effect Transistor). FIG. 19 shows change in inductance of the L2 when the gate voltage Vcnt to be applied to the gate terminal G of the n type MISFET 5 is changed. As can be seen from FIG. 19, it can be seen that an inductance value becomes variable by changing the gate voltage.

Since the inductor according to the present example can reduce a capacity between upper and lower adjacent wirings of the L1 side as described in Example 4, it is possible to restrain an upper limit frequency of a band width due to the wiring capacity from lowering in the case of a variable inductor.

In this regard, the variable inductor according to the present example has used the MISFET at both sides of the L1. However, since the voltage of both sides of the L1 may be able to be changed in an analog manner, various elements capable of changing a voltage value in an analog manner, such as variable resistance, can be used appropriately.

Further, even in the case where various elements capable of changing a voltage value in an analog manner are used at both sides of the L1 of the inductors according to Examples 5 to 7, the similar effect to that in the present example can be obtained.

While the invention has been particularly shown and described with reference to the exemplary embodiment and the examples thereof, the invention is not limited to the embodiment and the examples. It will be understood by those of ordinary skill in the art that various changes in form and details may be made therein without departing from the sprit and scope of this invention as defined by the claims.

This application is based upon and claims the benefit of priority from Japanese patent application No. 2007-014061, filed Jan. 24, 2007, the disclosure of which is incorporated herein in its entirety by reference.

The invention claimed is:

1. An inductor comprising at least four rolls of inductor placed in an insulating film formed on abuse substrate,
   wherein the inductor comprises a first inductor,
   wherein the first inductor comprises a one go-around of a first go-around wiring and a one go-around of a second go-around wiring, the one go-around of the first go-around wiring and the one go-around of the second go-around wiring being formed in first and second wiring layers, respectively, of a plurality of wiring layers formed in the insulating film,
   wherein the one go-around of the first go-around wiring formed in the first wiring layer and the one go-around of the second go-around wiring formed in the second wiring layer have one end connected to each other by a first via,
   wherein the one go-around of the first go-around wiring formed in the first wiring layer and the one go-around of the second go-around wiring formed in the second wiring layer are placed at substantially the same position in a surface of the base substrate when viewed from an upper side of the base substrate,
   wherein the first inductor further comprises a one go-around of a third go-around wiring formed in the second wiring layer, the one go-around of the third so-around wiring having one end directly connected, without use of any via, to another end of the one go-around of the second go-around wiring formed in the second wiring layer,
   wherein the first inductor further comprises a one go-around of a fourth go-around wiring formed in a third wiring layer, one end of go-around of the forth go-around wiring and another end of go-round of the third go-around wiring is connected to each other by a second via,
   wherein the one go-around of the third go-around wiring formed in the second wiring layer and the one go-around of the fourth go-around wiring formed in the third wiring layer are placed at substantially the same position in the surface of the base substrate when viewed from the upper side of the base substrate, and
   wherein the one go-around of the third go-around wiring and the one go-around of the fourth go-around wiring are placed inside the one go-around of the first go-around wiring formed in the first wiring layer and the one go-around of the second go-around wiring formed in the second wiring layer when viewed from the upper side of the base substrate.

2. The inductor as claimed in claim 1, wherein a wiring interval between the one go-around of the second go-around wiring and the one go-around of the third go-around wiring formed in the second wiring layer is larger than a wiring interval between adjacent two of the first, the second and the third wiring layers.

3. The inductor as claimed in claim 1, wherein a second inductor is placed in any of the plurality of wiring layers, and
   wherein the first inductor and the second inductor are magnetically coupled.

4. The inductor as claimed in claim 3, wherein the second inductor is placed outside or inside the first inductor when viewed from the upper side of the base substrate, or placed at substantially the same position as that of the first inductor.

5. The inductor as claimed in claim 3, wherein inductance of the first inductor is larger than inductance of the second inductor.

6. The inductor as claimed in claim 3, wherein wiring of the second inductor includes wiring formed in a wiring layer with the thickest film thickness of the plurality of wiring layers.

7. The inductor as claimed in claim 3, wherein a wiring width of the first inductor is a wiring width of wiring of the second inductor or narrower.

8. The inductor as claimed in claim 3, wherein wiring of the first inductor is formed in a wiring layer other than the wiring layer with the thickest film thickness of the plurality of wiring layers.

9. The inductor as claimed in claim 3, wherein one terminal of a variable resistance element is connected to a start point of the first inductor, and the other terminal of the variable resistance element is connected to an end point of the first inductor.

10. An inductor comprising at least four rolls of inductor placed in an insulating film formed on a base substrate,
    wherein the inductor comprises a first inductor,
    wherein the first inductor comprises a one go-around of a first go-around wiring and a one go-around of a second go-around wiring, the one go-around of the first go-around wiring and the one go-around of the second go-around wiring being formed in first and second wiring layers, respectively, of a plurality of wiring layers formed in the insulating film, wherein the one go-around of the first go-around wiring formed in the first wiring layer and the one go-around of the second go-around wiring formed in the second wiring layer have one end connected to each other by a first via, wherein the one go-around of the first go-around wiring formed in the first wiring layer and the one go-around of the second go-around wiring formed in the second wiring layer are placed at substantially the same position in a surface of the base substrate when viewed from an upper side of the base substrate, wherein the first inductor further comprises a one go-around of a third go-around wiring formed in the second wiring layer, the one go-around of the third go-around wiring having one end directly connected, without use of any via, to another end of the one go-around of the second go-around wiring in the second wiring layer, wherein the first inductor further comprises a one go-around of a fourth go-around wiring formed in the first wiring layer, the one go-around of the fourth go-around wiring having one end connected by a second via, to another end of the one go-around of the third go-around wiring, wherein the one go-around of the third go-around wiring formed in the second wiring layer and the one go-around of the fourth go-around wiring formed in the first wiring layer are placed at substantially the same position in the surface of the base substrate when viewed from the upper side of the base substrate, wherein the one go-around of the third go-around wiring and the one go-around of the fourth go-around wiring are placed inside the one go-around of the first go-around wiring and the one go-around of the second go-around wiring when viewed from the upper side of the base substrate, and wherein the first inductor further comprises an input terminal connected to another end of the one go-around of the first go-around wiring formed in the first wiring layer, and an output terminal connected to another end of the one go-around of the fourth go-around wiring formed in the first wiring layer.

11. The inductor as claimed in claim 10, wherein a wiring interval between the one go-around of the first go-around wiring and the one go-around of the fourth go-around wiring formed in the first wiring layer is larger than a wiring interval between the first and the second wiring layers.

12. The inductor as claimed in claim 10, wherein a second inductor is placed in any of the plurality of wiring layers, and
wherein the first inductor and the second inductor are magnetically coupled.

13. The inductor as claimed in claim 12, wherein the second inductor is placed outside or inside the first inductor when viewed from the upper side of the base substrate, or placed at substantially the same position as that of the first inductor.

14. The inductor as claimed in claim 12, wherein inductance of the first inductor is larger than inductance of the second inductor.

15. The inductor as claimed in claim 12, wherein wiring of the second inductor includes wiring formed in a wiring layer with the thickest film thickness of the plurality of wiring layers.

16. The inductor as claimed in claim 12, wherein a wiring width of the first inductor is a wiring width of wiring of the second inductor or narrower.

17. The inductor as claimed in claim 12, wherein wiring of the first inductor is formed in a wiring layer other than the wiring layer with the thickest film thickness of the plurality of wiring layers.

18. The inductor as claimed in claim 12, wherein one terminal of a variable resistance element is connected to the input terminal, and the other terminal of the variable resistance element is connected to the output terminal.

* * * * *

UNITED STATES PATENT AND TRADEMARK OFFICE
CERTIFICATE OF CORRECTION

PATENT NO. : 8,487,734 B2  
APPLICATION NO. : 13/397264  
DATED : July 16, 2013  
INVENTOR(S) : Akira Tanabe Page 1 of 1

It is certified that error appears in the above-identified patent and that said Letters Patent is hereby corrected as shown below:

In the Claims:

Column 13, Line 48: In Claim 1, delete "abuse" and insert -- a base --

Column 14, Line 3: In Claim 1, delete "so-" and insert -- go- --

Signed and Sealed this
Twenty-ninth Day of April, 2014

Michelle K. Lee
*Deputy Director of the United States Patent and Trademark Office*